United States Patent
Shan et al.

(10) Patent No.: US 10,033,362 B1
(45) Date of Patent: Jul. 24, 2018

(54) PVTM-BASED WIDE VOLTAGE RANGE CLOCK STRETCHING CIRCUIT

(71) Applicant: Southeast University, Nanjing (CN)

(72) Inventors: Weiwei Shan, Nanjing (CN); Liang Wan, Nanjing (CN); Longxing Shi, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 15/562,893

(22) PCT Filed: Feb. 24, 2017

(86) PCT No.: PCT/CN2017/074785
§ 371 (c)(1),
(2) Date: Sep. 29, 2017

(87) PCT Pub. No.: WO2017/197946
PCT Pub. Date: Nov. 23, 2017

(30) Foreign Application Priority Data

May 16, 2016 (CN) .......................... 2016 1 0323558

(51) Int. Cl.
*H03H 11/26* (2006.01)
*H03K 5/133* (2014.01)
*H03L 7/18* (2006.01)

(52) U.S. Cl.
CPC .............. *H03K 5/133* (2013.01); *H03L 7/18* (2013.01)

(58) Field of Classification Search
CPC .......... H03K 5/133; H03L 7/18; H03H 11/26
USPC .................................................. 327/270–273
See application file for complete search history.

(56) References Cited

U.S. PATENT DOCUMENTS

| 5,781,055 A * | 7/1998 | Bhagwan | H03K 5/133 327/158 |
| 2003/0155953 A1* | 8/2003 | Hirata | H03K 5/1504 327/236 |
| 2003/0214332 A1* | 11/2003 | Chen | H03L 7/081 327/156 |
| 2004/0037158 A1* | 2/2004 | Coteus | G11C 7/1045 365/233.1 |

(Continued)

FOREIGN PATENT DOCUMENTS

| CN | 104348449 A | 2/2015 |
| CN | 106026994 A | 10/2016 |

*Primary Examiner* — Ryan Jager
(74) *Attorney, Agent, or Firm* — Gokalp Bayramoglu

(57) ABSTRACT

A PVTM-based wide voltage range clock stretching circuit is disclosed. The circuit consists of a PVTM circuit module, a phase clock generation module, a clock synchronization selection module and a control module. The PVTM circuit module monitors in real time the delay information of an on-chip delay unit to monitor the operating environment of the circuit, and feeds the delay information back to the control module. Under the control of a clock stretching enable signal and a clock stretching extent signal, the control module selects a target phase clock from the clocks generated by the phase clock generation module in accordance with the feedback from the PVTM, enabling the stretching of system clock within a single cycle in different PVT conditions. Sophisticated gate devices are not required, and the cost of area and power consumption are kept to minimal.

9 Claims, 4 Drawing Sheets

(56) References Cited

U.S. PATENT DOCUMENTS

| | | | |
|---|---|---|---|
| 2005/0268142 A1* | 12/2005 | Saripalli | G06F 13/4291 |
| | | | 713/600 |
| 2006/0088137 A1* | 4/2006 | Jiang | H03L 7/00 |
| | | | 375/371 |
| 2006/0273827 A1* | 12/2006 | Kim | H03L 7/0805 |
| | | | 327/2 |
| 2007/0121773 A1* | 5/2007 | Kuan | H03L 7/081 |
| | | | 375/376 |
| 2010/0090736 A1* | 4/2010 | Kim | H03L 7/07 |
| | | | 327/158 |

* cited by examiner

| data of PVTM (N1) / actual data (N0) | FF | TT | SS |
|---|---|---|---|
| 1.1V 25° C | 54/53 | 40/40 | 28/28 |
| 0.8V 125° C | 35/33 | 20/20 | 11/10 |
| 0.7V 125° C | 26/25 | 13/13 | 4/4 |

PVTM-BASED WIDE VOLTAGE RANGE CLOCK STRETCHING CIRCUIT

CROSS REFERENCE TO RELATED APPLICATION

This application is the national phase entry of International Application No. PCT/CN2017/074785, filed on Feb. 24, 2017, which is based upon and claims priority to Chinese Patent Application No. 201610323558.2, filed on May 16, 2016, the entire contents of which are incorporated herein by reference.

TECHNICAL FIELD

The invention relates to the field of integrated circuit designing, more particularly, relates to a PVTM-based wide voltage range clock stretching circuit implemented with digital logic.

BACKGROUND

In recent years, the wide voltage range ICs are drawing great attention, which generally have a coverage from near-threshold/sub-threshold region to normal voltage region, and can operate in wide voltage range, so as to meet the high performance or energy-efficiency demands for chips under various loads. However, due to the PVT (Process, Voltage, and Temperature) variation and the problem of circuit aging, certain timing margins have to be preserved during circuit design to insure the proper operation of the circuit under the worst-case scenario, which leads to the degradation of performance and energy-efficiency. Since these adverse timing variations seldom occur simultaneously or even not at all, making the operating voltages too conservative and the chip performance far from optimal.

To achieve the high performance or energy-efficiency of chip, the timing margins are generally reduced to run the chip under lower voltage or higher frequency, which makes the chip more vulnerable to the critical path timing violation and results to the runtime error. The circuits of the razor structure employ typical online timing detecting method, which lowers the voltage to the limit until the circuit timing errors occur, and utilize in-situ or upper recovery mechanism to recover the chip's correct operating state. The monitoring unit employing these kinds of monitoring method is characterized in that: first, monitoring the timing operation to effectively determine whether there are errors in the circuit timing in one clock cycle; second, maintaining the correct timing results to achieve the error correction in case of timing errors. The monitoring unit consists of two timing units: a normal flip-flop and a shadow latch. During the design, by replacing the traditional flip-flop with the Razor monitoring unit, the timing monitoring and error correction functions for the circuit can be achieved easily. When the circuit is operating properly, the flip-flop in the monitoring unit acts with no difference from traditional flip-flop. But if there are errors in circuit timing, the shadow latch saves the correct timing result, which can be used in error correction of data.

By utilizing the online timing monitoring method to detect the delay variation of the on-chip timing monitoring unit, the PVT condition of the circuit may be obtained. According to this information, the system may make corresponding voltage or frequency adjustments to the target circuit to achieve high performance or energy-efficiency for the chip. The occurrence of errors in the chip indicate the timing violation, which means the timing margin is not enough at this time. To insure the proper operation of the chip, an immediate frequency reduction operation is required to increase the timing margin and address the problem of timing violation. The traditional frequency reduction methods are frequency division and modulating PLL configuration. While the frequency division can achieve immediate frequency reduction, it can only provide integer frequency division (divide-by-two is commonly used), thus the chip frequency drops significantly, leading to greater performance degradation. Although the dynamic PLL configuration may achieve more fine-grained frequency adjustment, the PLL adjustment needs a certain lock time, making the method unfavorable for fast frequency adjustment. The published clock stretching circuits have complex structure, generally achieve multiphase clock generation through DLL (Delay-Locked Loop) and have more precise delay phase control, but cost more area and are too complex which are unsuitable for the embedded low power chips.

SUMMARY OF INVENTION

Goals of Invention

The invention provides a clock stretching circuit with reduced response time and fine-grained stretching amount, to address the disadvantages of the clock stretching circuits employing PLL or frequency division. The invention enables the clock stretching according to the information fed back from the PVTM under the control of control signal, realizing fast, fine-grained frequency reduction and effectively reducing the area cost of the frequency adjustment module. The invention is particularly suitable for the online-timing-monitoring-based adaptive voltage frequency scaling circuit. When the circuit timing violation occurs, control signals are generated to stretch the clock, increasing the timing margin and avoiding timing errors in circuit operation.

Technical Solution

A PVTM-based wide voltage range clock stretching circuit of the invention comprises:

a PVTM (Process Voltage Temperature Monitor) circuit module, which monitors in real time the delay information of an on-chip delay unit and feeds the delay information back to a control module;

a phase clock generation module, which generates N phase clocks with different phases from the system clock, N is an integer larger than 1;

the control module, which under the control of a clock stretching enable signal and a clock stretching scaling signal, generates a control signal in accordance with the delay information fed back from the PVTM circuit module;

a clock synchronization selection module, which, in response to the control signal, selects a target phase clock for output from the system clock and N phase clocks, whereby enabling the stretching of the system clock within a single cycle.

Preferably, the PVTM circuit module comprises:

a frequency-division circuit, which divides the system clock via D flip-flops and generates a frequency divided clock;

a ring oscillator circuit, which comprises a two-input NAND gate and M stages of delay units which are in series connection (M is an integer larger than 1), in which an oscillation signal output by the last stage of delay unit and the frequency divided clock are input to the two-input NAND gate, whereby creating a closed loop;

a counter circuit 1, which receives the oscillation signal as input, samples the number of oscillation and outputs the sampling result to the control module.

Preferably, the control module comprises a counter circuit 2 for generating a N+1 bit clock selection control signal ctrl[N:0] which controls the selection of the target phase clock, in which only one bit of the clock selection control signal is active during each cycle.

The control module further comprises an encoder, when the encoder detects that the stretching enable signal turns from active to inactive, it generates a gating clock control signal which dictates whether the target phase clock should be gated for one cycle or not before output.

Further preferably, the clock synchronization selection module comprises N D flip-flops and several gate circuits, the lowest bit control signal and the system clock are operated through an AND gate, while the remaining N bits of the control signal and N phase clocks are respectively the data input and clock input signals of N D flip-flops to realize the synchronization. After the AND operations performed respectively on the data output signals and the clock input signals of N D flip-flops via AND gates, all N+1 outputs of AND gates are connected to an OR gate with N+1 input terminals, the output of the OR gate is the stretched clock.

Advantageous Effects

The PVTM-based wide voltage range clock stretching circuit of this invention utilizes N delay units to obtain N phase clocks having phases offset from each other. As the delay output of the delay unit is susceptible to PVT variations, the clock stretching result is coarse. To address this, the inventive circuit structure incorporates a PVTM circuit module, which selects the correct phase clock utilizing the feedback from the PVTM under the control of exterior signals, thus enabling a rapid, accurate clock stretching. In comparison with other traditional approaches, such as frequency division or modulating PLL configuration, the inventive method achieves a fast response within a single cycle, as well as more fine-grained stretching for the system clock, i.e., a small clock frequency variation, which addresses the problem of circuit timing violation while maintaining the chip performance. Also, the implementation of the circuit functions requires fewer cells, simpler gate devices, less area and power cost. The circuit structure of the invention is simple, easy to implement and trades some precision for less area cost, which is particularly suitable for the adaptive voltage frequency scaling circuit based on the online timing detection.

DETAILED DESCRIPTION OF EMBODIMENTS

In conjunction with attached drawings, the embodiments of the invention are described in detail hereinafter, but the scope of the invention is not limited by these embodiments.

Figure 1:
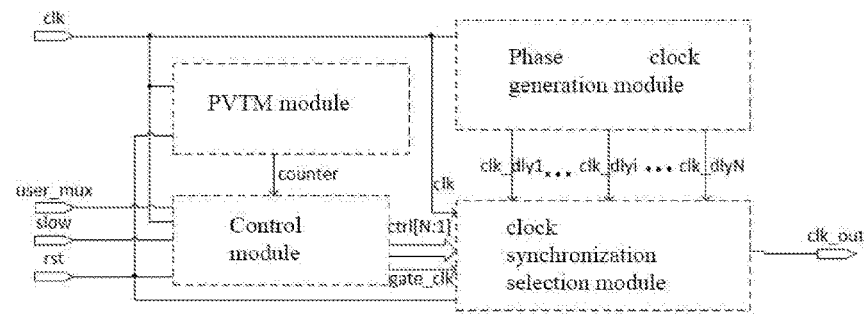
FIG. 1 is a block diagram of a PVTM-based wide voltage range clock stretching circuit.

As shown in FIG. 1, the inventive PVTM-based wide voltage range clock stretching circuit comprises a PVTM circuit module, a phase clock generation module, a clock synchronization selection module and a control module. The input signals of this circuit are a system clock clk, a reset signal rst, a clock stretching enable signal slow and a clock stretching scaling signal user_mux, and its output signal is the stretched clock clk_out. The PVTM circuit module monitors in real time the delay information of an on-chip delay unit to monitor the operating environment of the circuit and feeds the delay information back to the control module. Under the control of the clock stretching enable signal slow and the clock stretching scaling signal user__mux, the control module selects, in accordance with the feedback from the PVTM, a target phase clock from the clocks generated by the phase clock generation module, enabling the stretch of system clock within a single cycle in different PVT conditions.

The input signals of the PVTM circuit module are the system clock clk, the reset signal rst. Its output is the number of oscillations (counter), which is the input of the control module.

The input signal of the phase clock generation module is the system clock clk. Its output signals are N phase clocks clk_dly1 . . . clk_dlyi . . . clk_dlyN which have different phases, in which i=2, 3 . . . N−1, N is an integer larger than 1. The output are connected to the input of the clock synchronization selection module.

The input signals of the control module are the system clock clk, the reset signal rst, the clock stretching scaling signal user_mux and the feedback signal counter from the PVTM circuit module. Its outputs, which are respectively a N+1 bit control signal ctrl[N:0] and a gating clock control signal gate_clk, are connected to the input of the clock synchronization selection module.

The input signals of the clock synchronization selection module are the system clock clk, the reset signal rst, the gating clock control signal gate_clk, the phase clocks clk_dlyi (i=1, 2 . . . N) and the control signal ctrl[N:0] from the control module. Its output is the stretched clock clk_out.

Figure 2:
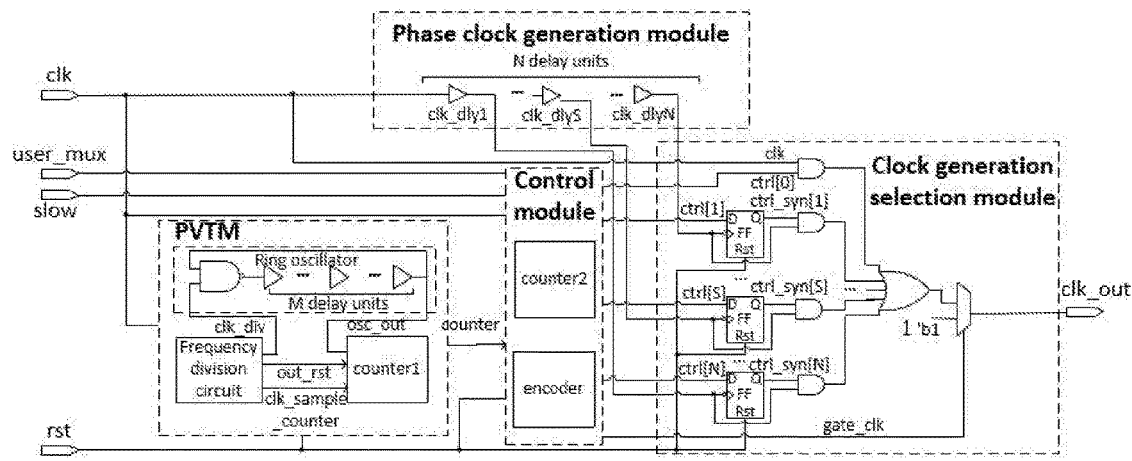
FIG. 2 is a schematic diagram of a PVTM-based wide voltage range clock stretching circuit.

As shown in FIG. 2, the PVTM circuit module forms a ring oscillator with delay units. The oscillator begins oscillating with the stimuli input. The oscillation number (counter) is recorded, which represents the circuit's PVT condition. It can be known through calculation that the oscillation number counter is the number of delay units that needed to get the target phase clock in this PVT condition. The counter is passed to subsequent control module, which, in conjunction with the input of clock stretching enable signal slow and clock stretching scaling signal user_mux, outputs a control signal ctrl[N:0] for selecting a target phase clock from the system clock and the clocks generated by the phase clock generation module, enabling the stretch of system clock within a single cycle in different PVT conditions.

The PVTM circuit module consists of three sub-circuits: a frequency division circuit, a ring oscillator circuit and a counter circuit 1. The frequency division circuit is formed by some rising-edge-triggered D flip-flops, which divides the system clock clk by K (K is an integer larger than 1) to get a frequency divided clock clk_div. The ring oscillator circuit is formed by a two-input NAND gate and M stages of delay units which are in series connection (M is an integer larger than 1), the inventive delay unit is equivalent to several series connected buffer stages. The signal osc_out output by the last stage of delay unit and the frequency divided clock clk_div are together input to the two-input NAND gate, whereby creating a closed loop. The clk_div input to the two-input NAND gate acts as the starting signal for the ring oscillator. When the clk_div is low, the output of the NAND gate is locked to high level and the ring oscillator doesn't work. When the clk_div is high, the ring oscillator starts oscillating and outputs an oscillation signal osc_out from the last stage of delay unit. The oscillation signal is a input to the counter circuit 1 of the PVTM circuit module, which counts the number of oscillations. When the clk_div turns from high to low level, the ring oscillator stops oscillating and the counter circuit 1 stops counting as well. At the same time, the frequency division circuit outputs an active sampling signal clk_sample_counter to the counter circuit 1 to sample the oscillation number. When the sampling is completed, the frequency division circuit outputs a reset signal out_rst to the counter circuit 1 to reset the counter, and the sample data (counter) is output to the control module.

With the oscillation number data (counter), the number N1 of delay units that are needed to form the delay chain of the phase clock generation module in current PVT condition may be calculated by means of the following formula:

$$N1 = \frac{(counter-1)*2*M}{K \div 2} = \frac{4M*(counter-1)}{K}(N1 <= N)$$

in which M is the number of delay units in the ring oscillator of the PVTM circuit module, and K is the times of frequency division. N is the maximal number of delay units needed among all PVT conditions. It is derived theoretically from the formula that in current environment, the phase clock clk_dlyN1 obtained from the N1th delay unit has a phase difference of 2π compared with the system clock clk. The N1 has certain error with respect to the number N0 of the actually needed delay units in the delay chain, but the error is within tolerance. In the ring oscillator of the PVTM circuit module, when the divided clock clk_div turns from high to low level, the ring oscillator stops. But considering the fact that the switch of clk_div may still cause a last oscillation of the oscillator, the counter value should be decreased by one to improve the precision of counting.

The phase clock generation module is formed by N stages of series connected delay units, which forms delay chain. To improve the accuracy of stretching, the delay units used in the chain is the same as those used in the ring oscillator of the PVTM circuit. In the phase clock generation module, the system clock clk is the initial input to the delay chain, and each stage of delay unit adds certain phase offset to the system clock, thereby N+1 phase clocks with different phases (considering the system clock as a phase clock) are obtained, in which the delay between adjacent phase clocks is the delay of one delay unit in current PVT condition.

In this invention, the stretched clock cycle is determined by the following formula:

$$T_{Stretch}=T_{Original}+\Delta t*N1/2^{user\_mux}$$

in which $T_{stretch}$ is the stretched clock cycle, $T_{original}$ is the original cycle without stretching (i.e. the system clock cycle), $\Delta t$ is the delay of one delay unit in current PVT condition, N1 is the number of delay units that are required by the delay chain of the phase clock generation module in current PVT condition. User_mux is a configurable input variable, which controls the clock stretch amount. The user_mux signal has a bit width of integer X. X depends on the minimal clock stretching amount $\frac{1}{2}^L$ (L is the largest decimal number that a binary number with bit width X can represent) that a user desires to accomplish. For example, when the bit width X is 2, the largest decimal number that can be represented is 3, thus the minimal clock stretch amount that can be accomplished is ⅛ cycle. Furthermore, ¼ cycle, ½ cycle can as well be accomplished by configuring the user_mux. Since N0 is the number of delay units that are actually needed to obtain a clock with a phase difference of a compared with the system clock clk in current environment, $\Delta t*N0 \approx T_{original}$, and since N0 and N1 have little difference, it can be derived that $\Delta t*N1*T_{original}$. As a result, different stretched clock cycles may be obtained by configuring user_mux differently. For example, when user_mux is set to 1, the stretched clock cycle is:

$$T_{Stretch}=T_{Original}+\Delta t*N1/2 \approx 3*T_{Original}/2$$

the control module generates a control signal in accordance with the input clock stretching enable signal slow and clock stretching scaling signal user_mux to determine the selection of clocks. The clock stretching enable signal slow functions to determine whether the clock is to be stretched. When slow=0, the clock control signal ctrl[0] is active, so the output of the module is the system clock. But when slow=1, the module is to stretch the system clock and selects a corresponding clock control signal ctrl[N:1] to output the stretched clock clk_out. The control signal output by the control module has a bit width of N+1, in which only one bit is high and the rest bits are low for each cycle, and the high level bit of the control signal represents the selection of the corresponding phase clock.

The control module consists of a counter circuit 2 and an encoder. The encoder circuit generates a gating clock signal gate_clk to determine whether the output clock should be gated for one cycle by detecting the negative edge of the stretching enable signal, i.e. by detecting the event of the enable signal turning from active to inactive. The counter circuit 2 increases by step size Z in each cycle, generating a single high level control signal ctrl[S] which corresponding to the chosen phase clock clk_dlyS, in which S=Z*i (i=1, 2, 3 . . . ), step size Z=counter/$2^{user\_mux}$. If S is larger than counter, which means the chosen phase clock clk_dlyS and the main clock clk have a phase difference larger than 2π, then the system reselects a phase clock, starting from clk_dly1. In addition, the control signal ctrl[N:0] should be set to low and kept low for one cycle. In the next cycle, set control signal ctrl[M] to high, i.e., clk_dlyM is selected, in which M=S-counter. Otherwise, since M is smaller than S, the active edge of clk_dlyM is ahead of clk_dlyS, both the ctrl_synM signal and the clk_dlyS signal of the clock synchronization module are set to high during a period between the active edges of clk_dlyM and clk_dlyS, which means two phase clocks are selected, thus leading to a function error.

Data synchronization should be performed, since the control signal of control module and corresponding phase clock signal are asynchronous and may result in glitch in the clock selection combinational logic circuit. That is, N negative-edge-triggered D flip-flops are employed to synchronize the control signal ctrl[N:1] from the control module with the corresponding phase clock signals clk_dlyN . . . clk_dly2, clk_dly1, in which, the S-th control signal ctrl[S] is the input data and the S-th phase clock clk_dlyS is the input clock for the S-th flip-flop and a synchronization control signal is output to avoid the glitch during clock selection (S=1, 2 . . . N). The control signal ctrl[0] won't go through synchronization, instead, which directly ANDed with the system clock clk. The synchronized signal ctrl_syn[S] is then ANDed with the clock signal clk_dlyS (S=1, 2 . . . N). All outputs of the number N+1 of AND gates are connected to an OR gate with N+1 input. The output of this OR gate is the stretched clock.

Since the inventive phase clock generation module is formed by delay chain, when the clock stretching enable signal turns from active to inactive (in the context of this invention, switching from 1 to 0), the control module must determine whether the output clock should be gated for one cycle or not, i.e., keeping the clk high for one cycle, to avoid undesirable glitch. When the clock stretching enable signal slow is inactive, if the chosen phase clock by the clock synchronization selection module has a phase difference no greater than π compared with the system clock, the gating clock control signal gate_clk is set to high, i.e., the current output clock is to be gated for one cycle. If the chosen phase clock by the clock synchronization selection module has a phase difference larger than π compared with the system clock, the gating clock control signal gate_clk is set to low, i.e., the current output clock back to the system clock and the stretching stops.

Figures 3, 4:
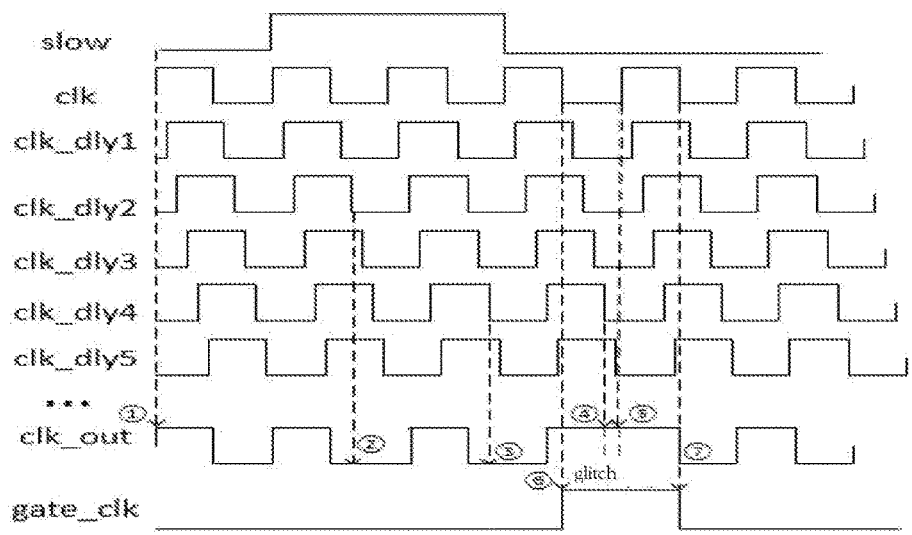
FIG. 3 is a schematic timing diagram of the clock stretching.
FIG. 4 illustrates the count values of PVTM versus actual results for different PVT conditions.

FIG. 3 is a schematic timing diagram of the clock stretching. The clock stretching operation involves selecting a desirable target phase clock according to different stretch amount.

The principle of clock stretch is specified in FIG. 3 as an example, in which the clock is stretched by a period delay of two delay units. When the clock stretching enable signal slow is low, the output signal clk_out is the system clock clk (as shown at ① in FIG. 3). When the clock stretching enable signal slow is active (i.e., at high level), the clock stretch begins. Since all flip-flops used in the inventive circuit are negative-edge-triggered, when the negative edge of clk occurs, the control signal ctrl[2] is high. Since the respective phase clocks and the control signal are asynchronous, undesired glitch may arise during clock selection, thus resulting the failure of circuit operation. To avoid glitch, the control signal ctrl[2] and the corresponding phase clock clk_dly2 are synchronized. Therefore, the clk_dly2 won't be selected until the negative edge of the clk_dly2 occurs (as shown at ② in FIG. 3). In the same way, when the second negative edge of clk occurs, the corresponding phase clock clk_dly4 won't be selected until synchronization is completed (as shown at ③ in FIG. 3), etc. When the clock stretching enable signal slow turns to low, the clock stretching stops and the system clock is selected. Since the phase difference between clk_out and clk is unknown at this time, if the system clock clk is immediately selected after the clock stretching enable signal slow turns to inactive, glitch or clock compression may occur. As shown in this FIG. 3, the system clock is selected after the clock stretching. Since the phase difference between clk_dly4 and clk is smaller than π, glitch occurs (as shown at ④, ⑤ in FIG. 3, with dashed lines), which impact the operation of circuit. As a result, clk_out need to be gated at this point for one clock cycle, i.e. setting gate_clk to high level (as shown at ⑥ in FIG. 3) and maintaining high level output for one cycle. When gate_clk turns to low, the system clock is output (as shown at ⑦ in FIG. 3).

As shown in FIG. 4, based on the SMIC 40 nm technology library, simulations have been run on the PVTM circuit module using Hsim software at different process corners, voltages, temperatures, which providing the statistical comparison between N0 and N1. It is found by comparison that the two parameters were very close, indicating high precision of the timing monitoring module.

Figure 5:
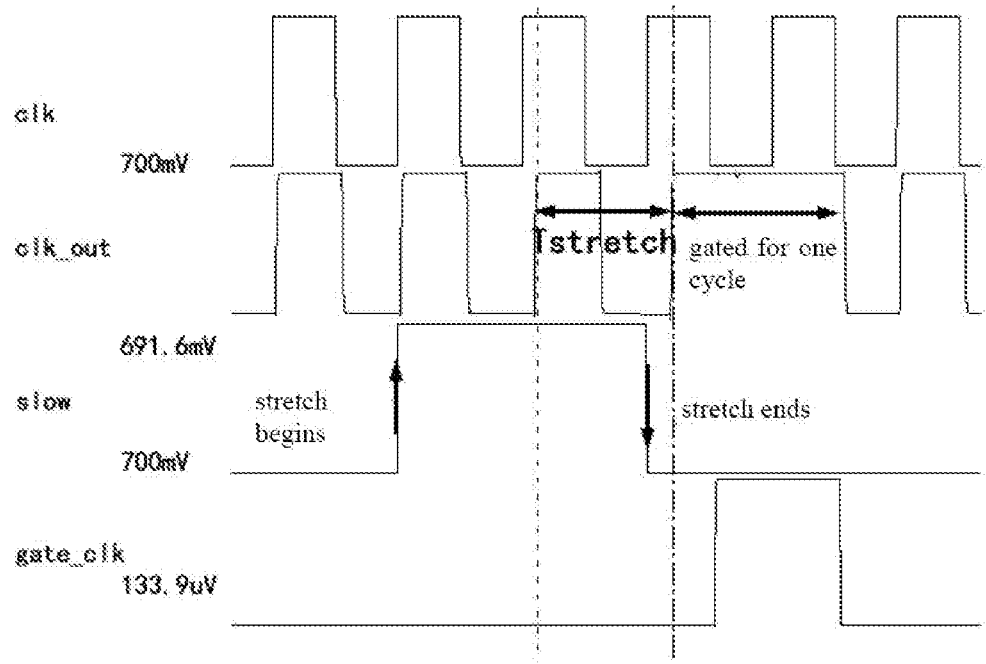
FIG. 5 is a simulated waveform of clk with ⅛ cycle stretch amount, at process corner FF, 0.7V, and 25° C.

FIG. 5 illustrates a simulated waveform with a stretching amount of ⅛ cycle at process corner FF, 0.7V, 25° C. The stretching signal slow is sampled at the negative edge of the flip-flop. It can be seen from the drawing that the low level of the output clock is stretched about ⅛ cycle and the response time is within one cycle. Since the phase difference between the output phase clock and the system clock clk is about n when the clock stretching enable signal slow is inactive, the clock output is gated for one cycle, i.e., maintaining high level output for one cycle, to avoid the clock compression in the circuit.

Figure 6:
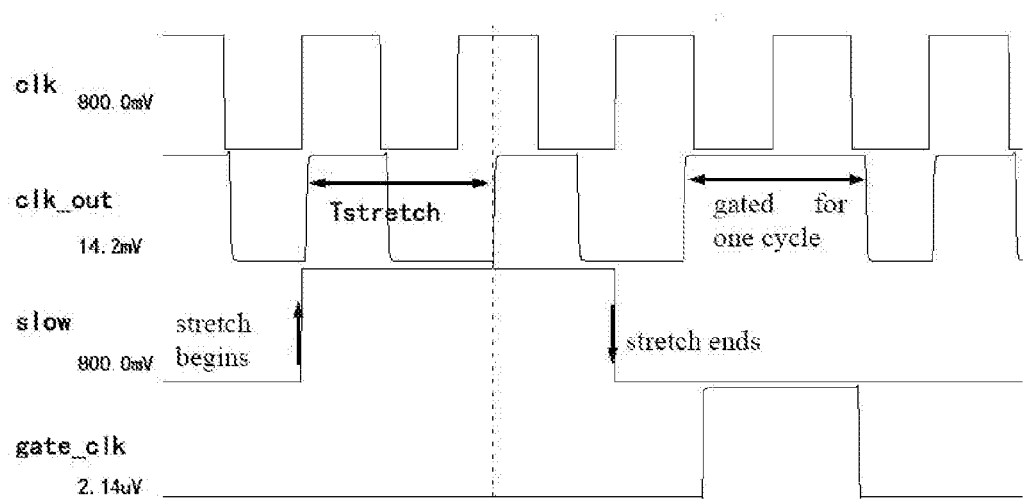
FIG. 6 is a simulated waveform of clk with ¼ cycle stretch amount, at process corner TT, 0.8V, and 25° C.

FIG. 6 illustrates a simulated waveform with a stretching amount of ¼ cycle at process corner TT, 0.8V, 25° C. The stretching signal slow is sampled at the negative edge of the flip-flop. It can be seen from the drawing that the output clock is stretched about ¼ cycle and the response time is within one cycle. Since the phase difference between the output phase clock and the system clock clk is about π when the clock stretching enable signal slow is inactive, the clock output is gated for one cycle, i.e., maintaining high level output for one cycle, to avoid the clock compression in the circuit.

Figure 7:
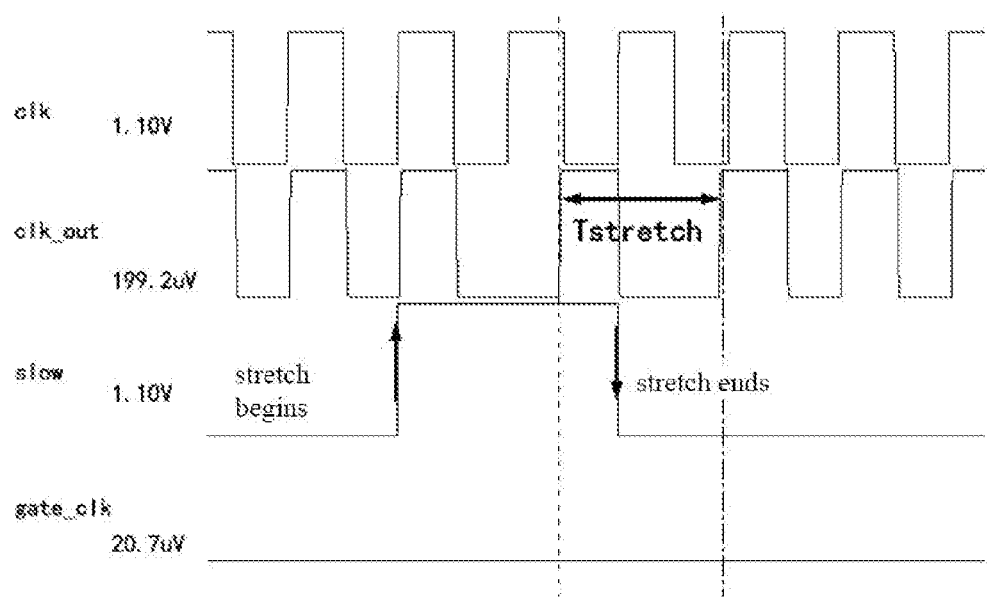
FIG. 7 is a simulated waveform of clk with ½ cycle stretch amount, at process corner SS, 1.1V, and 25° C.

FIG. 7 illustrates a simulated waveform with a stretching amount of ½ cycle at process corner SS, 1.1V, 25° C. The stretching signal slow is sampled at the negative edge of the flip-flop. It can be seen from the drawing that the output clock is stretched about ½ cycle and the response time is within one cycle. Since the phase difference between the output phase clock and the system clock clk is about 2 r when the clock stretching enable signal slow is inactive, clock compression will never happen, thus the circuit gating is unnecessary in this case.

Embodiment

The following is an embodiment of the PVTM-based wide voltage range clock stretching circuit, function simulations have been run on the circuit utilizing 40 nm technology library available from SMIC and the simulation software platform provided by Synopsys Inc. in different PVT conditions. The circuit structure of each module was designed initially and was modeled by utilizing Verilog HDL with functions simulated, verified and optimized. The operating frequency of the circuit was set to 200 MHz, the division times K of the frequency division circuit in the PVTM circuit module was set to 16, the number M of the delay units in the ring oscillator was 4 and the number N of the delay units in the delay chain of the phase clock generation module was 59. The simulations were run at various process corners such as FF, TT, SS, various voltages, temperatures, with different values of the clock stretching scaling signal user_mux. The simulation results are shown in FIG. 5, 6, 7.

FIG. 5, 6, 7 illustrates the circuits respond to the request for clock stretch and begin clock stretching at the negative edge of clk (within one cycle) when the clock stretching enable signal slow is active. With respect to requests for different stretching amount, different clock stretching periods are achieved. As shown in FIG. 6, at process corner TT, 0.8V, 25° C., with a clock stretching scaling signal user_mux of 2, the clock is stretched by ¼ cycle. It can be seen from the simulation waveform that samples are taken at the negative edge of the flip-flop when the stretching signal slow is active. As shown, the output clock is stretched about ¼ cycle, and the response time is within one cycle. Since the phase difference between the output phase clock and the system clock clk is about π when the clock stretching enable signal slow is inactive, the clock output is gated for one cycle, i.e., maintaining high level output, to avoid the clock compression in the circuit.

The above results demonstrate that this invention can achieve clock stretch within one cycle, with improved precision, less error and simpler circuit structure.

What is claimed is:

1. A PVTM-based wide voltage range clock stretching circuit, comprising:
   a PVTM circuit module, wherein the PVTM circuit module monitors in real time delay information from an on-chip delay unit and feeds the delay information back to a control module;
   a phase clock generation module, wherein the phase clock generation module generates N phase clocks with different phases from a system clock, N is an integer larger than 1;
   the control module, wherein the control module, under the control of a clock stretching enable signal and a clock stretching scaling signal, generates a control signal in accordance with the delay information fed back from the PVTM circuit module;
   a clock synchronization selection module, wherein the clock synchronization selection module, in response to the control signal, selects a target phase clock for output from the system clock and N phase clocks, whereby enabling the stretching of the system clock within a single cycle.

2. The PVTM-based wide voltage range clock stretching circuit of claim 1, wherein the PVTM circuit module comprises:
   a frequency-division circuit, wherein the frequency-division circuit divides the system clock via D flip-flops and generates a frequency divided clock;
   a ring oscillator circuit, wherein the ring oscillator which comprises a two-input NAND gate and M stages of delay units which are in series connection, M is an integer larger than 1, wherein an oscillation signal output by the last stage of delay unit and the frequency divided clock are input to the two-input NAND gate, whereby creating a closed loop;
   a first counter circuit, wherein the first counter circuit receives the oscillation signal as input, samples the number of oscillation, and outputs the sampling result to the control module.

3. The PVTM-based wide voltage range clock stretching circuit of claim 1, wherein the phase clock generation module comprises N stages of delay units which are in series connection.

4. The PVTM-based wide voltage range clock stretching circuit of claim 1, wherein the control module comprises a second counter circuit for generating a N+1 bit clock selection control signal ctrl[N:0] wherein the N+1 bit clock selection control signal ctrl[N:0] controls the selection of the target phase clock, wherein only one bit of the clock selection control signal is active during each cycle.

5. The PVTM-based wide voltage range clock stretching circuit of claim 4, wherein when the clock stretching enable signal is active, the second counter circuit increases by step size $Z=counter/2^{user\_mux}$ in each cycle, generating only one valid clock selection control signal ctrl[S] for selection of the corresponding phase clock, wherein counter is the value of the output signal of the PVTM circuit module and user_mux is the value of the clock stretching scaling signal, and $S=Z*i$, $i=1, 2, 3 \ldots$, when S is larger than counter, the system reselects a phase clock, beginning with the lowest phase clock generated by the phase clock generation module.

6. The PVTM-based wide voltage range clock stretching circuit of claim 1, wherein the control module comprises an encoder, when the encoder detects that the stretching enables signal turns from active to inactive, the encoder generates a gating clock control signal, wherein the gating clock control signal which determines whether the target phase clock should be gated for one cycle prior to output.

7. The PVTM-based wide voltage range clock stretching circuit of claim 1, wherein the clock synchronization selection module comprises N D flip-flops and several gate circuits, the lowest bit control signal and the system clock are ANDed through an AND gate, while the remaining N bits of the control signal are respectively the data input signals for the number N of D flip-flops, and N phase clocks are the clock input signals for N D flip-flops synchronized with the corresponding control signals, after the AND operations performed respectively on the data output signals and the clock input signals of N D flip-flops via AND gates, all N+1 outputs of AND gates are connected to an OR gate with N+1 input terminals, the output of the OR gate is the stretched clock.

8. The PVTM-based wide voltage range clock stretching circuit of claim 6, wherein when the clock stretching enable signal is inactive, if the current phase clock selected by the clock synchronization selection module has a phase difference no greater than π compared with respect to the system clock, the gating clock control signal is set to active and the current output clock is gated for one cycle, then the system stops clock stretching and outputs the system clock, if the current phase clock selected by the clock synchronization selection module has a phase difference greater than π with respect to the system clock, the gating clock control signal is set to inactive, then the system stops clock stretching and outputs the system clock.

9. The PVTM-based wide voltage range clock stretching circuit of claim 1, wherein N is the number of the delay units in the delay chain of the phase clock generation module, N is determined such that a phase clock differing in phase by 2π from the system clock is obtained at the end of the delay chain of the phase clock generation module under the current chip operating environment.

* * * * *